(12) United States Patent
Dilao et al.

(10) Patent No.: US 9,011,629 B2
(45) Date of Patent: Apr. 21, 2015

(54) ADHESIVE FOR ELECTRONIC COMPONENTS, AND MANUFACTURING METHOD FOR SEMICONDUCTOR CHIP MOUNT

(75) Inventors: Carl Alvin Dilao, Osaka (JP); Akinobu Hayakawa, Osaka (JP); Shujiro Sadanaga, Osaka (JP); Munehiro Hatai, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 37 days.

(21) Appl. No.: 13/883,641

(22) PCT Filed: Mar. 8, 2012

(86) PCT No.: PCT/JP2012/055985
§ 371 (c)(1),
(2), (4) Date: May 28, 2013

(87) PCT Pub. No.: WO2012/121336
PCT Pub. Date: Sep. 13, 2012

(65) Prior Publication Data
US 2013/0237018 A1    Sep. 12, 2013

(30) Foreign Application Priority Data

Mar. 9, 2011  (JP) ................. 2011-051886
Oct. 26, 2011  (JP) ................. 2011-235361

(51) Int. Cl.
| H01L 21/58 | (2006.01) |
| C09J 9/00 | (2006.01) |
| C09J 163/00 | (2006.01) |
| C08K 3/00 | (2006.01) |
| C08K 9/06 | (2006.01) |
| H01L 23/00 | (2006.01) |
| C09J 11/04 | (2006.01) |
| C08K 9/04 | (2006.01) |

(52) U.S. Cl.
CPC ............... *H01L 24/26* (2013.01); *C09J 11/04* (2013.01); *H01L 24/29* (2013.01); *C08K 9/04* (2013.01); *C08K 9/06* (2013.01); *H01L 24/81* (2013.01); *H01L 24/83* (2013.01); *H01L 2224/2929* (2013.01); *H01L 2224/29386* (2013.01); *H01L 2224/73204* (2013.01); *H01L 2224/81191* (2013.01); *H01L 2224/83192* (2013.01);
(Continued)

(58) Field of Classification Search
None
See application file for complete search history.

(56) References Cited

U.S. PATENT DOCUMENTS

| 6,555,187 B1 | 4/2003 | Kitamura |
| 2011/0147672 A1* | 6/2011 | Yang et al. ............ 252/511 |

FOREIGN PATENT DOCUMENTS

| CN | 1575096 | 2/2005 |
| JP | 3093621 | 7/2000 |

(Continued)

OTHER PUBLICATIONS

International Search Report issued Jun. 12, 2012 in International (PCT) Application No. PCT/JP2012/055985.

*Primary Examiner* — Michael J Feely
(74) *Attorney, Agent, or Firm* — Wenderoth, Lind & Ponack, L.L.P.

(57) ABSTRACT

An adhesive for electronic components, including a curable compound, a curing agent, and an inorganic filler, wherein A1 and A2/A1 fall within a range surrounded by solid lines and a dashed line in Fig. 1A wherein a viscosity at 5 rpm measured at 25° C. using an E type viscometer is A1 (Pa·s) and a viscosity at 0.5 rpm measured at 25° C. using an E type viscometer is A2 (Pa·s), the range including values on the solid lines but not including values on the dashed line, and a blending amount of the curing agent is 5 to 150 parts by weight and a blending amount of the inorganic filler is 60 to 400 parts by weight based on 100 parts by weight of the curable compound.

14 Claims, 2 Drawing Sheets

(52) U.S. Cl.
CPC ............... *H01L2224/83855* (2013.01); *H01L 2924/00014* (2013.01)

(56) References Cited

FOREIGN PATENT DOCUMENTS

| JP | 2003-258034 | 9/2003 |
| JP | 2004-363434 | 12/2004 |
| JP | 2005-32796 | 2/2005 |
| JP | 2005-527113 | 9/2005 |
| JP | 2006-286916 | 10/2006 |
| JP | 2007-258508 | 10/2007 |
| JP | 2009-96886 | 5/2009 |
| JP | 2010-10669 | 1/2010 |
| TW | 200908166 | 2/2009 |
| WO | 03/101164 | 12/2003 |

\* cited by examiner

ADHESIVE FOR ELECTRONIC COMPONENTS, AND MANUFACTURING METHOD FOR SEMICONDUCTOR CHIP MOUNT

TECHNICAL FIELD

The present invention relates to an adhesive for electronic components that allows suppression of occurrence of voids and is prevented from wicking up to an upper surface of a semiconductor chip. The present invention also relates to a production method for a semiconductor chip mount using the adhesive for electronic components.

BACKGROUND ART

Recent semiconductor devices have been increasingly smaller and highly integrated. To respond to this change, flip chip mounting using a semiconductor chip having a projected electrode (bump) made of a material such as solder is often used. For example, Patent Literature 1 describes a production method for a semiconductor device in which a bump electrode in a semiconductor device is electrically connected to a terminal electrode in a substrate, and a sealing material is injected into a gap between the semiconductor device and the substrate.

Patent Literature 1 aims to pursuit the limit of the viscosity and thixotropic properties needed to obtain good sealing properties of the sealing material. As described in Patent Literature 1, if the sealing material is a composition whose viscosity is 100 Pa·s or less and thixotropic index is 1.1 or less, the sealing material can be sufficiently injected into a narrow gap quickly without producing air bubbles in injecting the sealing material.

Patent Literature 2 describes a curable underfill bonding composition containing surface-treated nanoparticles as an underfill material in which the nanoparticles are substantially spherical, non-agglomerated, amorphous, and solid. As described in Patent Literature 2, use of the surface-modified nanoparticles attains an underfill adhesive having a desirable coefficient of thermal expansion (CTE) and providing useful viscosity ranges for use of capillary underfill processes.

Unfortunately, the size of the semiconductor chip has been smaller and smaller, leading to a narrower pitch between bumps these days. Accompanied by these, the gap between semiconductor chips or the gap between the semiconductor chip and the substrate has also become narrower. For this reason, the air is easily contained in the sealing resin (underfill) in injecting the sealing resin, resulting in occurrence of voids.

In order to solve the problem, for example, methods have been examined in which a sealing resin is applied in advance in a bonding area, instead of the method in which a sealing resin is injected into the gap after electrodes are bonded. For example, Patent Literature 3 describes a production method for a semiconductor device in which a predetermined liquid sealing resin composition is applied to a position in a circuit on the surface of an inorganic substrate or organic substrate at which a semiconductor element is to be mounted; an electrode of the semiconductor element is bonded to a circuit on the substrate with bumps being interposed therebetween, and at the same time, the liquid sealing resin composition is cured.

Unfortunately, even the method according to Patent Literature 3 cannot sufficiently eliminate the possibility of occurrence of voids. Moreover, in the method according to Patent Literature 3, the sealing resin easily wicks up to the upper surface of the semiconductor chip to contaminate an attachment of a bonding apparatus. Furthermore, voids occur easily, for example, when the underfill material according to Patent Literature 2 is used in the method according to Patent Literature 3.

CITATION LIST

Patent Literature

Patent Literature 1: JP 3093621 B (Japanese Patent No. 3093621)
Patent Literature 2: JP 2005-527113 A (Japanese Kohyo Publication No. 2005-527113)
Patent Literature 3: JP 2009-96886 A (Japanese Kokai Publication No. 2009-96886)

SUMMARY OF INVENTION

Technical Problem

An object of the present invention is to provide an adhesive for electronic components that allows suppression of occurrence of voids and is prevented from wicking up to an upper surface of a semiconductor chip. Another object of the present invention is to provide a production method for a semiconductor chip mount using the adhesive for electronic components.

Solution to Problem

The present invention is an adhesive for electronic components, including a curable compound, a curing agent, and an inorganic filler, wherein A1 and A2/A1 fall within a range surrounded by solid lines and a dashed line in FIG. 1A wherein a viscosity at 5 rpm measured at 25° C. using an E type viscometer is A1 (Pa·s) and a viscosity at 0.5 rpm measured at 25° C. using an E type viscometer is A2 (Pa·s), the range including values on the solid lines but not including values on the dashed line, and a blending amount of the curing agent is 5 to 150 parts by weight and a blending amount of the inorganic filler is 60 to 400 parts by weight based on 100 parts by weight of the curable compound.

Hereinafter, the present invention will be described in detail.

The present inventors found out that in a production method for a semiconductor chip mount in which a semiconductor chip having a projected electrode is bonded to a substrate by flip chip mounting, and sealing is performed, if an adhesive for electronic components, including a curable compound, a curing agent, and an inorganic filler in a predetermined blending ratio and having viscosity properties and thixotropic properties within predetermined ranges, is used as an adhesive for electronic components applied onto the substrate in advance, occurrence of voids can be suppressed, and the adhesive for electronic components can be prevented from wicking up to an upper surface of the semiconductor chip. Thus, the present invention has been completed.

The adhesive for electronic components according to the present invention is an adhesive for electronic components which includes a curable compound, a curing agent, and an inorganic filler, wherein A1 and A2/A1 fall within a range surrounded by solid lines and a dashed line in FIG. 1A wherein a viscosity at 5 rpm measured at 25° C. using an E type viscometer is A1 (Pa·s) and a viscosity at 0.5 rpm measured at 25° C. using an E type viscometer is A2 (Pa·s). The values on the solid lines are included but the values on the dashed line are not included.

Herein, the viscosity of the adhesive for electronic components is measured using an E type viscosity measurement apparatus such as a VISCOMETER TV-22 (made by TOKAI SANGYO CO., LTD.). A2/A1 means a value obtained by dividing the viscosity at 0.5 rpm, A2 (Pa·s), by the viscosity at 5 rpm, A1 (Pa·s), in which the viscosities are obtained by measuring the adhesive for electronic components at 25° C. using the E type viscometer. A2/A1 is an index indicating the thixotropic properties of the adhesive for electronic components.

The range surrounded by the solid lines and the dashed line in FIG. 1A is a range derived from the viscosity properties and thixotropic properties of the adhesive for electronic components measured in examples and comparative examples.

In FIG. 1A, the abscissa indicates A1 (Pa·s), and the ordinate indicates A2/A1. If A1 and A2/A1 fall within the range surrounded by the solid lines and the dashed line in FIG. 1A, occurrence of voids can be suppressed even if air bubbles are contained in a step of contacting a projected electrode of a semiconductor chip with an electrode portion on a substrate and injecting the adhesive for electronic components into a sealed region. Further, the adhesive for electronic components can be prevented from wicking up to the upper surface of the semiconductor chip. The reason that occurrence of voids can be suppressed as above is presumed as follows: when the adhesive for electronic components is injected into the sealed region, the adhesive for electronic components demonstrating the physical properties wets and spreads, and squeezes out air bubbles during injection of the adhesive into the sealed region.

In the case where A1 is excessively small and A1 and A2/A1 do not fall within the range surrounded by the solid lines and the dashed line in FIG. 1A, the adhesive for electronic components has excessively high fluidity. For this reason, the adhesive for electronic components wets and spreads excessively in the step of applying the adhesive for electronic components onto the substrate, and overlays an alignment mark provided in the vicinity of the sealed region. As a result, alignment is difficult. Moreover, a fillet is undesirably long in the step of contacting the projected electrode of the semiconductor chip with the electrode portion on the substrate and injecting the adhesive for electronic components into the sealed region. Thereby, the wiring portion in the substrate may be contaminated.

In the case where A1 is excessively great and A1 and A2/A1 do not fall within the range surrounded by the solid lines and the dashed line in FIG. 1A, the adhesive for electronic components does not wet and spread sufficiently when the adhesive for electronic components is injected into the sealed region, leading to difficulties in suppression of occurrence of voids.

The value A1 is not particularly limited as long as A1 and A2/A1 fall within the range surrounded by the solid lines and the dashed line in FIG. 1A. The lower limit is preferably 25 Pa·s, and the upper limit is preferably 150 Pa·s. The lower limit is more preferably 30 Pa·s, and the upper limit is more preferably 130 Pa·s.

In the case where A2/A1 is excessively small and A1 and A2/A1 do not fall within the range surrounded by the solid lines and the dashed line in FIG. 1A, occurrence of voids is difficult to suppress. Additionally, the shape of the adhesive for electronic components is difficult to keep in the step of applying the adhesive for electronic components onto the substrate and the step of contacting the projected electrode of the semiconductor chip with the electrode portion on the substrate, and injecting the adhesive for electronic components into the sealed region.

In the case where A2/A1 is excessively great and A1 and A2/A1 do not fall within the range surrounded by the solid lines and the dashed line in FIG. 1A, the adhesive for electronic components cannot be sufficiently prevented from wicking up to the upper surface of the semiconductor chip when the projected electrode of the semiconductor chip is contacted with or bonded to the electrode portion on the substrate. For this reason, the adhesive for electronic components easily adheres to the attachment of the bonding apparatus.

The value of A2/A1 is not particularly limited as long as A1 and A2/A1 fall within the range surrounded by the solid lines and the dashed line in FIG. 1A. The lower limit is preferably 2.2, and the upper limit is preferably 4.5. The lower limit is more preferably 2.5, and the upper limit is more preferably 4. The upper limit is still more preferably 3.8, and the upper limit is particularly preferably 3.5.

Within the range surrounded by the solid lines and the dashed line in FIG. 1A, A1 and A2/A1 preferably fall within the range surrounded by the solid lines in FIG. 3.

The range surrounded by the solid lines in FIG. 3 is the range obtained by connecting the points located outermost among the points (A1, A2/A1) obtained in the examples.

A1 and A2/A1 can be controlled to fall within the range surrounded by the solid lines and the dashed line in FIG. 1A by adjusting the kinds and blending amounts of the curable compound, the curing agent, the inorganic filler, and when necessary components such as a surfactant, which are contained in the adhesive for electronic components according to the present invention.

If the curable compound is contained, the adhesive for electronic components according to the present invention has high curability and high reliability after curing. Preferably, the curable compound has an SP value of approximately 8 to 14 from the viewpoint of controlling both of the viscosity properties and thixotropic properties of the adhesive for electronic components to fall within desired ranges.

The curable compound is not particularly limited. Preferably, the curable compound contains at least one compound selected from the group consisting of epoxy compounds, bismaleimide compounds, and episulfide compounds.

Examples of the epoxy compounds include, but not limited to, bisphenol epoxy compounds such as bisphenol A epoxy compounds, bisphenol F epoxy compounds, bisphenol AD epoxy compounds, and bisphenol S epoxy compounds; novolak epoxy compounds such as phenol novolak epoxy compounds and cresol novolak epoxy compounds; resorcinol epoxy compounds; aromatic epoxy compounds such as trisphenolmethane triglycidyl ether; naphthalene epoxy compounds; fluorene epoxy compounds; dicyclopentadiene epoxy compounds; polyether-modified epoxy compounds; benzophenone epoxy compounds; aniline epoxy compounds; NBR-modified epoxy compounds; CTBN-modified epoxy compounds, and hydrogenated products thereof. Among these, the benzophenone epoxy compounds are preferable because fast curing properties are easily obtained. These epoxy compounds may each be used alone or in combination with one another.

Among the bisphenol F epoxy compounds, examples of commercially available products thereof include EXA-830-LVP and EXA-830-CRP (all made by DIC Corporation).

Among the resorcinol epoxy compounds, examples of commercially available products thereof include EX-201 (made by Nagase ChemteX Corporation).

Among the polyether-modified epoxy compounds, examples of commercially available products thereof include EX-931 (made by Nagase ChemteX Corporation), EXA-4850-150 (made by DIC Corporation), and EP-4005 (made by Adeka Corporation).

In the case where the adhesive for electronic components according to the present invention contains the epoxy compound, the blending amount of the epoxy compound is not particularly limited. The lower limit of the blending amount of the epoxy compound based on 100 parts by weight of the adhesive for electronic components is preferably 15 parts by weight. The upper limit is preferably 60 parts by weight. The lower limit is more preferably 25 parts by weight, and the upper limit is more preferably 50 parts by weight.

Examples of the bismaleimide compounds include, but not limited to, thermal initiation type free radical curable bismaleimide compounds commercially available from K.I Chemical Industry Co., Ltd., Daia Kasei Kogyo Co., Ltd., Ciba Specialty Chemicals Inc., National Starch and Chemical Company, and others.

In the case where the adhesive for electronic components according to the present invention contains the bismaleimide compound, the blending amount of the bismaleimide compound is not particularly limited. The lower limit of the blending amount of the bismaleimide compound based on 100 parts by weight of the adhesive for electronic components is preferably 15 parts by weight. The upper limit is preferably 60 parts by weight. The lower limit is more preferably 25 parts by weight. The upper limit is more preferably 50 parts by weight.

The episulfide compound is not particularly limited as long as the compound has an episulfide group. Examples of the episulfide compound include compounds in which an oxygen atom in an epoxy group in an epoxy compound is replaced by a sulfur atom.

Examples of the episulfide compound specifically include bisphenol episulfide compounds (compounds in which an oxygen atom in an epoxy group in bisphenol epoxy compounds is replaced by a sulfur atom), hydrogenated bisphenol episulfide compounds, dicyclopentadiene episulfide compounds, biphenyl episulfide compounds, phenol novolak episulfide compounds, fluorene episulfide compounds, polyether-modified episulfide compounds, butadiene-modified episulfide compounds, triazine episulfide compounds, and naphthalene episulfide compounds. Among these, the naphthalene episulfide compounds are preferable. These episulfide compounds may each be used alone or in combination with one another.

The oxygen atom may be replaced by the sulfur atom in at least part of the epoxy groups or in all the epoxy groups.

Among the episulfide compounds, examples of commercially available products thereof include YL-7007 (a hydrogenated bisphenol A episulfide compound, made by Mitsubishi Chemical Corporation). The episulfide compounds can be easily synthesized from an epoxy compound using a sulfurizing agent such as potassium thiocyanate and thiourea.

When the adhesive for electronic components according to the present invention contains the episulfide compound, the blending amount of the episulfide compound is not particularly limited. The lower limit of the blending amount of the episulfide compound based on 100 parts by weight of the adhesive for electronic components is preferably 3 parts by weight, and the upper limit is preferably 12 parts by weight. The lower limit is more preferably 6 parts by weight, and the upper limit is more preferably 9 parts by weight.

The adhesive for electronic components according to the present invention may contain a polymer compound having a functional group reactable with the curable compound (hereinafter, also simply referred to as a polymer compound having a reactable functional group). If the adhesive for electronic components according to the present invention contains the polymer compound having a reactable functional group, the adhesive for electronic components has improved bonding reliability when strain is caused by heat.

In the case where the epoxy compound is used as the curable compound, examples of the polymer compound having a reactable functional group include polymer compounds having an amino group, a urethane group, an imide group, a hydroxyl group, a carboxyl group, and an epoxy group. Among these, the polymer compounds having an epoxy group are preferable. If the adhesive for electronic components according to the present invention contains the polymer compound having an epoxy group, the cured product of the adhesive for electronic components demonstrates high flexibility. Namely, the cured product can have high mechanical strength, heat resistance, and moisture resistance derived from the epoxy compound as the curable compound and high flexibility derived from the polymer compound having an epoxy group. The cured product also has high thermal shock cycle resistance, reflow soldering resistance, and dimensional stability, and demonstrates high adhesion reliability and conduction reliability.

The polymer compound having an epoxy group is not particularly limited, and may be a polymer compound having an epoxy group at the terminal and/or the side chain (pendant position). Examples thereof include epoxy group-containing acrylic rubbers, epoxy group-containing butadiene rubbers, bisphenol high molecular weight epoxy compounds, epoxy group-containing phenoxy resins, epoxy group-containing acrylic resins, epoxy group-containing urethane resins, and epoxy group-containing polyester resins. Among these, epoxy group-containing acrylic resins are preferable because these resins can contain a large amount of epoxy groups, and attain higher mechanical strength and heat resistance of the cured product of the adhesive for electronic components. These polymer compounds having an epoxy group may each be used alone or in combination with one another.

In the case where the polymer compound having an epoxy group, particularly the epoxy group-containing acrylic resin is used as the polymer compound having a reactable functional group, the lower limit of the weight average molecular weight of the polymer compound having an epoxy group is preferably 10000. If the polymer compound having an epoxy group has a weight average molecular weight less than 10000, the flexibility of the cured product of the adhesive for electronic components may not be sufficiently improved.

In the case where the polymer compound having an epoxy group, particularly the epoxy group-containing acrylic resin is used as the polymer compound having a reactable functional group, the lower limit of the epoxy equivalent of the polymer compound having an epoxy group is preferably 200, and the upper limit is preferably 1000. If the polymer compound having an epoxy group has an epoxy equivalent less than 200, the flexibility of the cured product of the adhesive for electronic components may not be sufficiently improved. If the polymer compound having an epoxy group has an epoxy equivalent more than 1000, the mechanical strength and heat resistance of the cured product of the adhesive for electronic components may be reduced.

In the case where the adhesive for electronic components according to the present invention contains the polymer compound having a reactable functional group, the blending amount of the polymer compound having a reactable functional group is not particularly limited. The lower limit of the blending amount of the polymer compound having a reactable functional group based on 100 parts by weight of the curable compound is preferably 1 part by weight, and the upper limit is preferably 30 parts by weight. A blending amount less than 1 part by weight may reduce the bonding reliability of the adhesive for electronic components when strain is caused by heat. A blending amount more than 30 parts by weight may reduce the mechanical strength, heat resistance, and moisture resistance of the cured product of the adhesive for electronic components.

The curing agent is not particularly limited, and known curing agents can be properly selected according to the curable compound. In the case where the epoxy compound is used as the curable compound, examples of the curing agent include thermosetting acid anhydride curing agents such as trialkyltetrahydrophthalic anhydride; phenol curing agents; amine curing agents; latent curing agents such as dicyandiamide; and cationic catalyst curing agents. These curing agents may each be used alone or in combination with one another.

As the blending amount of the curing agent based on 100 parts by weight of the curable compound, the lower limit is 5 parts by weight, and the upper limit is 150 parts by weight. At a blending amount of the curing agent less than 5 parts by weight, the cured product of the adhesive for electronic components becomes fragile, or defects such as insufficient curing of the curing agent are caused. At a blending amount of the curing agent more than 150 parts by weight, the heat resistance of the cured product of the adhesive for electronic components is reduced.

In addition to the curing agent, preferably, the adhesive for electronic components according to the present invention contains a curing accelerator in order to control the curing rate or the curing temperature.

Examples of the curing accelerator include, but not limited to, imidazole curing accelerators and tertiary amine curing accelerators. Among these, the imidazole curing accelerators are preferable because the curing rate is easily controlled. These curing accelerators may each be used alone or in combination with one another.

Examples of the imidazole curing accelerator include, but not limited to, 1-cyanoethyl-2-phenylimidazole in which the 1-position of imidazole is protected by a cyanoethyl group, and imidazole curing accelerators having a basic group protected by isocyanuric acid (trade name "2MA-OK", made by SHIKOKU CHEMICALS CORPORATION). These imidazole curing accelerators may each be used alone or in combination with one another.

Examples of the curing accelerators include 2MZ, 2MZ-P, 2PZ, 2PZ-PW, 2P4MZ, C11Z-CNS, 2PZ-CNS, 2PZCNS-PW, 2MZ-A, 2MZA-PW, C11Z-A, 2E4MZ-A, 2MAOK-PW, 2PZ-OK, 2MZ-OK, 2PHZ, 2PHZ-PW, 2P4 MHZ, 2P4 MHZ-PW, 2E4MZ•BIS, VT, VT-OK, MAVT, and MAVT-OK (all made by SHIKOKU CHEMICALS CORPORATION).

The blending amount of the curing accelerator is not particularly limited. As the blending amount of the curing accelerator based on 100 parts by weight of the curable compound, the lower limit is preferably 1 part by weight, and the upper limit is preferably 10 parts by weight.

In the case where the epoxy compound is used as the curable compound and the curing agent is used in combination with the curing accelerator, the blending amount of the curing agent to be used is preferably an equivalent logically needed for the epoxy group in the epoxy compound or less. If the blending amount of the curing agent is more than the equivalent logically needed, due to moisture, chlorine ions may be easily eluted from the cured product obtained by curing the adhesive for electronic components. Namely, if the curing agent is excessively blended, and the eluted component is extracted from the cured product of the adhesive for electronic components using hot water, for example, the extracted water has a pH of approximately 4 to 5. For this reason, a large amount of chlorine ions may be eluted from the epoxy compound. Accordingly, the pH of pure water after 1 g of the cured product of the adhesive for electronic components is immersed in 10 g of pure water at 100° C. for 2 hours is preferably 6 to 8, and more preferably 6.5 to 7.5.

More preferably, the adhesive for electronic components according to the present invention contains a surfactant having a functional group whose solubility parameter (SP value) is 13 or more and a functional group whose solubility parameter (SP value) is not less than 9 and less than 13 (herein, also referred to as a surfactant (1)), and the inorganic filler has a degree of hydrophobicity (M value) of 20 or less (herein, also referred to as an inorganic filler (1)).

Alternatively, preferably, the adhesive for electronic components according to the present invention further contains a surfactant having a functional group whose solubility parameter (SP value) is less than 9 and a functional group whose solubility parameter (SP value) is not less than 9 and less than 13 (herein, also referred to as a surfactant (2)), and the inorganic filler has a degree of hydrophobicity (M value) of 45 or more (herein, also referred to as an inorganic filler (2)).

Occurrence of voids is more easily suppressed as the adhesive for electronic components has higher thixotropic properties. Usually, a certain amount or more of the inorganic filler needs to be blended in order to enhance reliability. The adhesive for electronic components having a certain amount or more of the inorganic filler blended tends to have higher viscosity, however. If a thixotropic agent is further added to such an adhesive for electronic components having high viscosity in order to enhance the thixotropic properties, the viscosity is further increased to reduce application properties of the adhesive. Additionally, the thixotropic properties of the adhesive are difficult to control.

The present inventors found out that only in the case where an inorganic filler demonstrating a specific degree of hydrophobicity (M value) and a surfactant having a functional group demonstrating a specific solubility parameter (SP value) are selected and used in combination, both of the viscosity properties and thixotropic properties of the adhesive are easily controlled to fall within desired ranges by good interaction between the inorganic filler and the surfactant even if the inorganic filler is blended to obtain sufficient reliability.

By using the inorganic filler (1) in combination with the surfactant (1) or the inorganic filler (2) in combination with the surfactant (2), the surfactant is adsorbed to the surface of the inorganic filler at a low shear force. The surfactant ties the inorganic fillers to each other to increase the viscosity of the adhesive. Meanwhile, at a high shear force, the surfactant relaxes collision of the inorganic fillers to reduce the viscosity of the adhesive. Namely, higher thixotropic properties can be attained to suppress occurrence of voids.

Moreover, in the adhesive for electronic components containing the inorganic filler (1) and the surfactant (1) or the inorganic filler (2) and the surfactant (2), in spite of the high thixotropic properties, the viscosity of the adhesive is not increased beyond necessity, and good application properties are attained as described above. Further, both the viscosity properties and the thixotropic properties of the adhesive are controlled to fall within desired ranges. For this reason, the adhesive for electronic components can be prevented from wicking up to the upper surface of the semiconductor chip.

The degree of hydrophobicity (M value) is an index indicating hydrophobicity. The degree of hydrophobicity (M value) means the concentration of methanol (% by weight)

when methanol is dropped into water to which the inorganic filler has been added, and the inorganic filler is completely swollen.

Examples of a method for controlling the M value of the inorganic filler include a method in which the inorganic filler is surface-treated to change the number of hydrophilic groups existing on the surface of the inorganic filler. Specifically, examples of the method include a method in which the carbon content is controlled by modifying surfaces of silica fine particles with —$CH_3$, thereby to control the M value. The silica fine particles having the carbon content controlled by such a method are commercially available from Tokuyama Corporation and others.

Meanwhile, the solubility parameter (SP value) is an index indicating hydrophilicity. The solubility parameter (SP value) can be determined as a calculated value by a Fedor's method from an expression $\delta^2 = \Sigma E / \Sigma V$. Here, $\delta$ means an SP value, E means cohesive energy, and V means a molar volume.

First, a combination of the inorganic filler (1) and the surfactant (1) will be described.

The inorganic filler (1) has a degree of hydrophobicity (M value) of 20 or less. The surfactant (1) has a functional group whose solubility parameter (SP value) is 13 or more and a functional group whose solubility parameter (SP value) is not less than 9 and less than 13.

The inorganic filler having an M value more than 20 does not provide good interaction with the surfactant (1). As a result, the effect of controlling the thixotropic properties of the adhesive is reduced. More preferably, the inorganic filler (1) has an M value of 18 or less.

Examples of the inorganic filler (1) include fine particles having an M value of 20 or less and made of silica, titanium oxide, black carbon, alumina, graphene, mica, or the like. Among these, silica fine particles having an M value of 20 or less are preferable. These inorganic fillers (1) may each be used alone or in combination with one another.

Examples of commercially available products of the inorganic filler (1) include SE-2050 (M value of 0, the carbon content of 0% by weight, made by Admatechs Company Limited), SE-2050-SET (M value of 20, the carbon content of 0% by weight, made by Admatechs Company Limited), SE-2050-SEJ (M value of 20, the carbon content of 0% by weight, made by Admatechs Company Limited), SE-1050 (M value of 0, the carbon content of 0% by weight, made by Admatechs Company Limited), SE-4050 (M value of 0, the carbon content of 0% by weight, made by Admatechs Company Limited), UFP-80 (M value of 20, made by Denki Kagaku Kogyo K.K.), and QS-40 (M value of 0, the carbon content of 0% by weight, made by Tokuyama Corporation).

The adhesive for electronic components containing the inorganic filler (1) and the surfactant (1) may contain an inorganic filler having an M value more than 20 in order, for example, to reduce the coefficient of linear expansion of the adhesive for electronic components to enhance the reliability of the adhesive, if the effect of the invention is not inhibited. In this case, the lower limit of the blending amount of the inorganic filler (1) in the entire inorganic filler is preferably 10% by weight. At a blending amount less than 10% by weight, the effect of controlling the thixotropic properties may not be sufficiently obtained. As the blending amount of the inorganic filler (1) in the entire inorganic filler, the lower limit is more preferably 15% by weight.

Meanwhile, the surfactant not having a functional group whose SP value is 13 or more or a functional group whose SP value is not less than 9 and less than 13 does not provide good interaction with the inorganic filler (1). As a result, the effect of controlling the thixotropic properties is reduced. The SP value of the functional group whose SP value is 13 or more is more preferably 16 or more. The lower limit of the SP value of the functional group whose SP value is not less than 9 and less than 13 is more preferably 9.5, and the upper limit is more preferably 12.5.

Examples of the functional group whose SP value is 13 or more include a primary amine group (SP value of 16.5), a carbinol group (SP value of 16.58), a carboxyl group (SP value of 15.28), and a phosphate group (SP value of 13.36). Examples of the functional group whose SP value is not less than 9 and less than 13 include an epoxy group (SP value of 12.04), a propoxymethyloxirane group (SP value of 9.78), a mercapto group (SP value of 11.07), a methacryloyl group (SP value of 9.60), a phenol group (SP value of 11.5), and a polyether group (SP value of 9.71).

Examples of the surfactant (1) include silicone compounds, anionic surfactants, cationic surfactants, amphoteric surfactants, and nonionic surfactants which have the functional group whose SP value is 13 or more and the functional group whose SP value is not less than 9 and less than 13. Among these, the silicone compounds are preferable because the functional group can be controlled. These surfactants (1) may each be used alone or in combination with one another.

Examples of commercially available products of the surfactant (1) include BYK-W9010 (made by BYK Japan K. K., having a phosphate group whose SP value is 13.36 and a polyether group whose SP value is 9.71), and X-22-3939A (amino•polyether-modified silicone oil, made by Shin-Etsu Chemical Co., Ltd., having a primary amine group whose SP value is 16.5 and a polyether group whose SP value is 9.71).

As the blending amount of the surfactant (1) based on 100 parts by weight of the inorganic filler (1), the lower limit is preferably 0.4 parts by weight, and the upper limit is preferably 4 parts by weight. At a blending amount less than 0.4 parts by weight, the effect of controlling the thixotropic properties may not be sufficiently obtained. At a blending amount more than 4 parts by weight, when the obtained adhesive for electronic components is thermally cured, the surfactant (1) may volatilize to cause voids. As the blending amount of the surfactant (1) based on 100 parts by weight of the inorganic filler (1), the lower limit is more preferably 0.8 parts by weight, and the upper limit is more preferably 2 parts by weight.

Next, a combination of the inorganic filler (2) and the surfactant (2) will be described.

The inorganic filler (2) has a degree of hydrophobicity (M value) of 45 or more. The surfactant (2) has a functional group whose solubility parameter (SP value) is less than 9 and a functional group whose solubility parameter (SP value) is not less than 9 and less than 13.

The inorganic filler having an M value less than 45 does not provide good interaction with the surfactant (2). As a result, the effect of controlling the thixotropic properties is reduced.

Examples of the inorganic filler (2) include fine particles having an M value of 45 or more and made of silica, titanium oxide, black carbon, alumina, graphene, mica, and the like. Among these, silica fine particles having an M value of 45 or more are preferable. These inorganic fillers (2) may each be used alone or in combination with one another.

Examples of commercially available products of the inorganic filler (2) include SE-2050-STJ (M value of 64, made by Admatechs Company Limited), SE-1050-STT (M value of 64, made by Admatechs Company Limited), fumed silica (MT-10, M value of 47, the carbon content of 0.9% by weight, made by Tokuyama Corporation), fumed silica (HM-20L, M value of 64, the carbon content of 2.4% by weight, made by Tokuyama Corporation), and fumed silica (PM-20L, M value of 65, and the carbon content of 5.5% by weight, made by Tokuyama Corporation).

The adhesive for electronic components containing the inorganic filler (2) and the surfactant (2) may contain an inorganic filler having an M value less than 45 in order, for example, to reduce the coefficient of linear expansion of the adhesive for electronic components to enhance the reliability of the adhesive, if the effect of the invention is not inhibited. In this case, as the blending amount of the inorganic filler (2) in the entire inorganic filler, the lower limit is preferably 10% by weight. At a blending amount less than 10% by weight, the effect of controlling the thixotropic properties may not be sufficiently obtained. As the blending amount of the inorganic filler (2) in the entire inorganic filler, the lower limit is more preferably 15% by weight.

Meanwhile, the surfactant not having a functional group whose SP value is less than 9 or a functional group whose SP value is not less than 9 and less than 13 does not provide good interaction with the inorganic filler (2). As a result, the effect of controlling the thixotropic properties is reduced.

Examples of the functional group whose SP value is less than 9 include a methyl group (SP value of 6.44), an ethyl group (SP value of 6.97), a butyl group (SP value of 7.39), and a dimethylsiloxane group (SP value of 7.40). Examples of the functional group whose SP value is not less than 9 and less than 13 include an epoxy group (SP value of 12.04), a propoxymethyloxirane group (SP value of 9.78), a mercapto group (SP value of 11.07), a methacryloyl group (SP value of 9.60), a phenol group (SP value of 11.5), and a polyether group (SP value of 9.71).

Examples of the surfactant (2) include silicone compounds, anionic surfactants, cationic surfactants, amphoteric surfactants, and nonionic surfactants which have the functional group whose SP value is less than 9 and the functional group whose SP value is not less than 9 and less than 13. Among these, the silicone compounds are preferable because the functional group can be controlled. These surfactants (1) may each be used alone or in combination with one another.

Examples of commercially available products of the surfactant (2) include epoxy-modified silicone oil (KF-101, made by Shin-Etsu Chemical Co., Ltd., having an epoxy group whose SP value is 12.04 and a dimethylsiloxane group whose SP value is 7.40), carboxyl-modified silicone oil (X-22-162 C, made by Shin-Etsu Chemical Co., Ltd., having a carboxylethyl group whose SP value is 11.10 and a dimethylsiloxane group whose SP value is 7.40), and epoxy•polyether-modified silicone oil (X-22-4741, made by Shin-Etsu Chemical Co., Ltd., having an epoxy group whose SP value is 12.04, a polyether group whose SP value is 9.71, and a dimethylsiloxane group whose SP value is 7.55).

As the blending amount of the surfactant (2) based on 100 parts by weight of the inorganic filler (2), the lower limit is preferably 0.4 parts by weight, and the upper limit is preferably 4 parts by weight. At a blending amount less than 0.4 parts by weight, the effect of controlling the thixotropic properties may not be sufficiently obtained. At a blending amount more than 4 parts by weight, when the obtained adhesive for electronic components is thermally cured, the surfactant (2) may volatilize to cause voids. As the blending amount of the surfactant (2) based on 100 parts by weight of the inorganic filler (2), the lower limit is more preferably 0.8 parts by weight, and the upper limit is preferably 2 parts by weight.

Herein, when matters common to the inorganic filler (1) and the inorganic filler (2) are described, the inorganic filler (1) and the inorganic filler (2) will be simply referred to as the inorganic filler.

In the inorganic filler, the lower limit of the average particle size is preferably 0.1 μm, and the upper limit is preferably 3 μm. If the average particle size is within the range above, A1 and A2/A1 are easily controlled to fall within the range surrounded by the solid lines and the dashed line in FIG. 1A, occurrence of voids can be further suppressed, and the adhesive for electronic components can be further prevented from wicking up to the upper surface of semiconductor chip. At an average particle size less than 0.1 μm, the viscosity of the adhesive for electronic components is easily increased, and the adhesive for electronic components does not wet and spread sufficiently when the adhesive for electronic components is injected into the sealed region. For this reason, occurrence of voids may not be suppressed. At an average particle size more than 3 μm, the inorganic filler may enter between electrodes. In the inorganic filler the lower limit of the average particle size is more preferably 0.3 μm, and the upper limit is more preferably 1 μm. The upper limit is still more preferably 0.5 μm.

Preferably, the inorganic filler is surface-treated, and thereby has a group derived from a surface treatment agent on its surface. By surface treating the inorganic filler, A1 and A2/A1 are easily controlled to fall within the range surrounded by the solid lines and the dashed line in FIG. 1A even if a large amount of the inorganic filler is added to the adhesive for electronic components, occurrence of voids can be further suppressed, and the adhesive for electronic components can be further prevented from wicking up to the upper surface of the semiconductor chip. Moreover, by adding a large amount of the inorganic filler to the adhesive for electronic components, the coefficient of linear expansion of the adhesive for electronic components after curing can be kept low to improve the bonding reliability of the adhesive for electronic components.

Examples of the surface treatment agent include aminosilane compounds, methylsilane compounds, vinylsilane compounds, styrylsilane compounds, mercaptosilane compounds, phenylsilane compounds, (meth)acrylic silane compounds, and expoxysilane compounds. Among these, the phenylsilane compounds or the (meth) acrylic silane compounds are preferable.

Examples of the phenylsilane compounds include N-phenyl-3-aminopropyltrimethoxysilane.

Examples of the (meth)acrylic silane compounds include 3-methacryloxypropyltrimethoxysilane, 3-methacryloxypropyltriethoxysilane, 3-methacryloxypropylmethyldimethoxysilane, and 3-methacryloxypropylmethyldiethoxysilane.

Examples of the expoxysilane compounds include 2-(3,4-epoxycyclohexyl)ethyltrimethoxysilane, 3-glycidoxypropyltrimethoxysilane, 3-glycidoxypropyltriethoxysilane, 3-glycidoxypropylmethyldimethoxysilane, and 3-glycidoxypropylmethyldiethoxysilane.

As the blending amount of the inorganic filler based on 100 parts by weight of the curable compound, the lower limit is 60 parts by weight, and the upper limit is 400 parts by weight. At a blending amount of the inorganic filler less than 60 parts by weight, the adhesive for electronic components cannot keep sufficient bonding reliability. At a blending amount of the inorganic filler more than 400 parts by weight, the viscosity of the adhesive for electronic components is easily increased, and the adhesive for electronic components does not wet and spread sufficiently when the adhesive for electronic components is injected into the sealed region. For this reason, occurrence of voids may not be suppressed. As the blending amount of the inorganic filler based on 100 parts by weight of the curable compound, the lower limit is preferably 66 parts by weight, and the upper limit is preferably 300 parts by weight.

If only an inorganic filler having a group derived from the phenylsilane compound or the (meth)acrylic silane compound on the surface thereof is used as the inorganic filler and a large amount of the inorganic filler is added, A1 and A2/A1 may not fall within the range surrounded by the solid lines and the dashed line in FIG. 1A. In such a case, by using the inorganic filler having a group derived from the phenylsilane compound or the (meth) acrylic silane compound on the surface thereof in combination with the inorganic filler having a group derived from the expoxysilane compound on the surface thereof, A1 and A2/A1 are preferably controlled to fall within the range surrounded by the solid lines and the dashed line in FIG. 1A.

In the case where the inorganic filler having a group derived from the phenylsilane compound or the (meth)acrylic silane compound on the surface thereof is used in combination with the inorganic filler having a group derived from the expoxysilane compound on the surface thereof, as the blending amount of the inorganic filler having a group derived from the expoxysilane compound on the surface thereof based on 100 parts by weight of the inorganic filler having a group derived from the phenylsilane compound or the (meth)acrylic silane compound on the surface thereof, the lower limit is preferably 20 parts by weight, and the upper limit is preferably 150 parts by weight.

Alternatively, a thixotropic agent may be used as the inorganic filler.

If the thixotropic agent is contained, A1 and A2/A1 are easily controlled to fall within the range surrounded by the solid lines and the dashed line in FIG. 1A, occurrence of voids can be further suppressed, and the adhesive for electronic components can be further prevented from wicking up to the upper surface of the semiconductor chip.

Examples of the thixotropic agent include, but not limited to, metal fine particles and inorganic fine particles of calcium carbonate, fumed silica, aluminum oxide, boron nitride, aluminum nitride, aluminum borate, and the like. Among these, fumed silica is preferable.

When necessary, the thixotropic agent may be surface-treated. The surface-treated thixotropic agent is not particularly limited. Preferably, the surface-treated thixotropic agent is particles having a hydrophobic group on the surfaces thereof. Specifically, examples of the surface-treated thixotropic agent include fumed silica whose surface is hydrophobized.

In the case where the thixotropic agent is particulate, the average particle size of the particulate thixotropic agent is not particularly limited. The preferable upper limit is 1 μm. At an average particle size of the particulate thixotropic agent more than 1 μm, the adhesive for electronic components may not demonstrate desired thixotropic properties.

In the adhesive for electronic components according to the present invention, the blending amount of the thixotropic agent is not particularly limited. In the case where the thixotropic agent is not surface-treated, the lower limit is preferably 0.5% by weight, and the upper limit is preferably 20% by weight. At a blending amount of the thixotropic agent less than 0.5% by weight, the adhesive for electronic components may not obtain sufficient thixotropic properties. At a blending amount of the thixotropic agent more than 20% by weight, eliminating properties of the adhesive for electronic components may be reduced during production of the semiconductor device. The lower limit of the blending amount of the thixotropic agent is more preferably 3% by weight, and the upper limit is more preferably 10% by weight.

In order to reduce viscosity, the adhesive for electronic components according to the present invention may contain a diluting agent.

The diluting agent preferably has an epoxy group. The lower limit of the number of epoxy groups in one molecule is preferably 2, and the upper limit is preferably 4. If the number of epoxy groups in one molecule is less than 2, the adhesive for electronic components after curing may not demonstrate sufficient heat resistance. If the number of epoxy groups in one molecule is more than 4, strain may be caused by curing, or the epoxy group may remain not cured. Thereby, bonding strength may be reduced, or bonding defects may be caused by repeated thermal stress. In the diluting agent, the upper limit of the number of epoxy groups in one molecule is more preferably 3.

Preferably, the diluting agent has an aromatic ring and/or a dicyclopentadiene structure.

In the diluting agent, the upper limit of the weight loss at 120° C. and that of the weight loss at 150° C. are preferably 1%. If the weight loss at 120° C. and the weight loss at 150° C. are more than 1%, a non-reacted product undesirably volatilizes during or after curing of the adhesive for electronic components, and productivity or the performance of the semiconductor device to be obtained may be affected.

Preferably, the diluting agent has a curing initiation temperature lower than that of the curable compound and a curing rate higher than that of the curable compound.

In the case where the adhesive for electronic components according to the present invention contains the diluting agent, as the blending amount of the diluting agent in the adhesive for electronic components according to the present invention, the lower limit is preferably 1% by weight, and the upper limit is preferably 20% by weight. If the blending amount of the diluting agent is out of the range above, the viscosity of the adhesive for electronic components may not be sufficiently reduced.

When necessary, the adhesive for electronic components according to the present invention may contain a solvent.

Examples of the solvent include, but not limited to, aromatic hydrocarbons, chlorinated aromatic hydrocarbons, chlorinated aliphatic hydrocarbons, alcohols, esters, ethers, ketones, glycol ethers (cellosolves), alicyclic hydrocarbons, and aliphatic hydrocarbons.

When necessary, the adhesive for electronic components according to the present invention may contain an inorganic ion exchanger.

Among the inorganic ion exchangers, examples of commercially available products thereof include IXE series (made by TOAGOSEI CO., LTD.). In the case where the adhesive for electronic components according to the present invention contains the inorganic ion exchanger, the blending amount of the inorganic ion exchanger is not particularly limited. The upper limit is preferably 10% by weight, and the lower limit is preferably 1% by weight.

When necessary, the adhesive for electronic components according to the present invention may contain other additives such as a bleed preventing agent, and an adhesiveness enhancer such as an imidazolesilane coupling agent.

In the adhesive for electronic components according to the present invention, the lower limit of the coefficient of linear expansion at 40 to 80° C. after curing the adhesive is preferably 20 ppm/° C., and the upper limit is preferably 50 ppm/° C. At a coefficient of linear expansion less than 20 ppm/° C., the coefficient of linear expansion of the adhesive is lower than those of the projected electrode of the semiconductor chip, the substrate, and the like. For this reason, stress concentrates on the bonding portion when the projected electrode, the substrate, and the like thermally expand. As a result, peeling may be caused in the bonding portion. Namely, the adhesive for electronic components may not keep sufficient bonding reliability. At a coefficient of linear expansion more than 50 ppm/° C., the stress applied to the bonded semiconductor chip becomes larger when strain is caused by heat. For this reason, the conductive portion of the projected electrode or the like is easily cracked. Namely, the adhesive for electronic components may not keep sufficient bonding reliability. In the adhesive for electronic components according to the present invention, the lower limit of the coefficient of linear expansion at 40 to 80° C. after curing the adhesive is more preferably 25 ppm/° C., and the upper limit is more preferably 45 ppm/° C.

The method of producing the adhesive for electronic components according to the present invention is not particularly limited. Examples of the method include a method in which using a homodisper or the like, the components such as the curable compound, the curing agent, the inorganic filler, and when necessary the surfactant are stirred and mixed.

Application of the adhesive for electronic components according to the present invention is not particularly limited. The adhesive for electronic components according to the present invention is suitably used for a production method for a semiconductor chip mount in which a semiconductor chip having a projected electrode is bonded to a substrate by flip chip mounting and sealing is performed.

One aspect of the present invention is a production method for a semiconductor chip mount in which a semiconductor chip having a projected electrode is bonded to a substrate by flip chip mounting and sealing is performed, the method including the steps of: applying the adhesive for electronic components according to the present invention onto the substrate; contacting the projected electrode of the semiconductor chip with an electrode portion on the substrate with the adhesive for electronic components being interposed therebetween, and injecting the adhesive for electronic components into a sealed region; bonding the projected electrode of the semiconductor chip to the electrode portion on the substrate, and curing the adhesive for electronic components in the bonding portion; and completely curing the adhesive for electronic components.

The production method for a semiconductor chip mount according to the present invention is a production method for a semiconductor chip mount in which the semiconductor chip having a projected electrode is bonded to the substrate by flip chip mounting and sealing is performed.

In the production method for a semiconductor chip mount according to the present invention, first, the step of applying the adhesive for electronic components according to the present invention onto the substrate is performed.

The method for applying the adhesive for electronic components onto the substrate is not particularly limited. Examples of the method include a method in which a syringe having a precision nozzle attached thereto is used in combination with a dispenser to apply the adhesive for electronic components.

In the production method for a semiconductor chip mount according to the present invention, next, the step of contacting the projected electrode of the semiconductor chip with the electrode portion on the substrate with the adhesive for electronic components being interposed therebetween and injecting the adhesive for electronic components into the sealed region is performed.

In the step, preferably, the semiconductor chip is pressed to contact the projected electrode of the semiconductor chip with the electrode portion on the substrate, and the adhesive for electronic components is injected into the sealed region. The pressure when the semiconductor chip is pressed is not particularly limited. Preferably, the pressure is 0.1 to 10 N per projected electrode. At a pressure less than 0.1 N, the projected electrode of the semiconductor chip may not be contacted with the electrode in the substrate. At a pressure more than 10 N, the projected electrode of the semiconductor chip may be excessively depressed to be brought into contact with the adjacent projected electrode, leading to short circuit.

When the projected electrode of the semiconductor chip is contacted with the electrode portion on the substrate and the adhesive for electronic components is injected into the sealed region, the temperature and the time are not particularly limited as long as the effect of the invention is not inhibited. For example, the temperature is 120 to 220° C., the pressure is 1 to 30 N, and the time is 0.1 to 60 seconds. In the case where the projected electrode of the semiconductor chip and the like are solder, heating may be performed at a temperature of the melting temperature of solder or less.

In the production method for a semiconductor chip mount according to the present invention, next, the step of bonding the projected electrode of the semiconductor chip to the electrode portion on the substrate, and curing the adhesive for electronic components in the bonding portion is performed.

When the projected electrode of the semiconductor chip is bonded to the electrode portion on the substrate and the adhesive for electronic components in the bonding portion is cured, the temperature and the time are not particularly limited if the effect of the invention is not inhibited. For example, the temperature is 230 to 300° C., the pressure is 1 to 30 N, and the time is 0.1 to 60 seconds. In the case where the projected electrode of the semiconductor chip and the like are solder, heating may be performed at a temperature of the melting temperature of solder or more.

In the production method for a semiconductor chip mount according to the present invention, further, the step of completely curing the adhesive for electronic components is performed. Thereby, the adhesive for electronic components is completely cured to obtain a semiconductor chip mount in which the projected electrode of the semiconductor chip is bonded to the electrode portion on the substrate.

When the adhesive for electronic components is completely cured, the curing condition is not particularly limited. According to the curing properties of the adhesive for electronic components, the curing condition can be properly selected and used. For example, the curing condition is at 120° C. for 30 minutes or at 170° C. for 30 minutes.

In the production method for a semiconductor chip mount according to the present invention, by controlling A1 and A2/A1 to fall within the range surrounded by the solid lines and the dashed line in FIG. 1A, occurrence of voids can be suppressed even if air bubbles are contained in the step of contacting the projected electrode of the semiconductor chip with the electrode portion on the substrate and injecting the adhesive for electronic components into the sealed region. Further, the adhesive for electronic components can be prevented from wicking up to the upper surface of the semiconductor chip.

Advantageous Effects of Invention

The present invention can provide an adhesive for electronic components that allows suppression of occurrence of voids and is prevented from wicking up to an upper surface of a semiconductor chip. The present invention also can provide a production method for a semiconductor chip mount using the adhesive for electronic components.

DESCRIPTION OF EMBODIMENTS

Hereinafter, aspects of the present invention will be described more in detail using the following examples, but the present invention will not be limited to only these examples.

Examples 1 to 33 and Comparative Examples 1 to 20

(1) Production of Adhesive for Electronic Components

Figure 2:
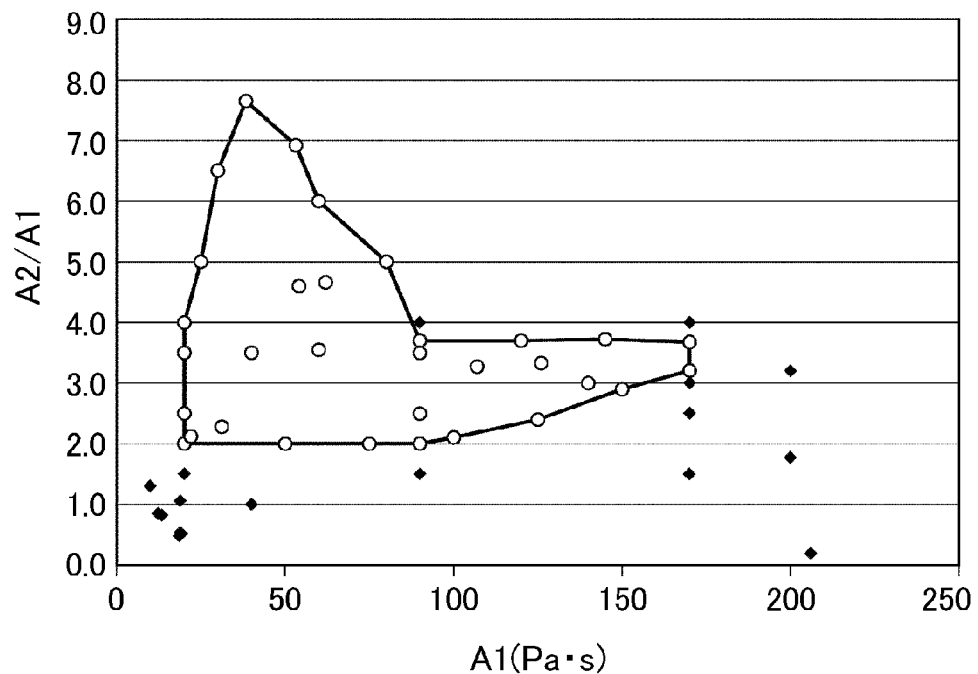
FIG. 2 is a graph showing the range of A1 and A2/A1 specified in the present invention (values on the solid lines are included but values on the dashed line are not included) wherein the viscosity at 5 rpm of the adhesive for electronic components measured at 25° C. using an E type viscometer is A1 (Pa·s) and the viscosity at 0.5 rpm of the adhesive for electronic components measured at 25° C. using an E type viscometer is A2 (Pa·s), and the relationships between A1 and A2/A1 obtained in Examples and Comparative Examples are plotted.
Figure 3:
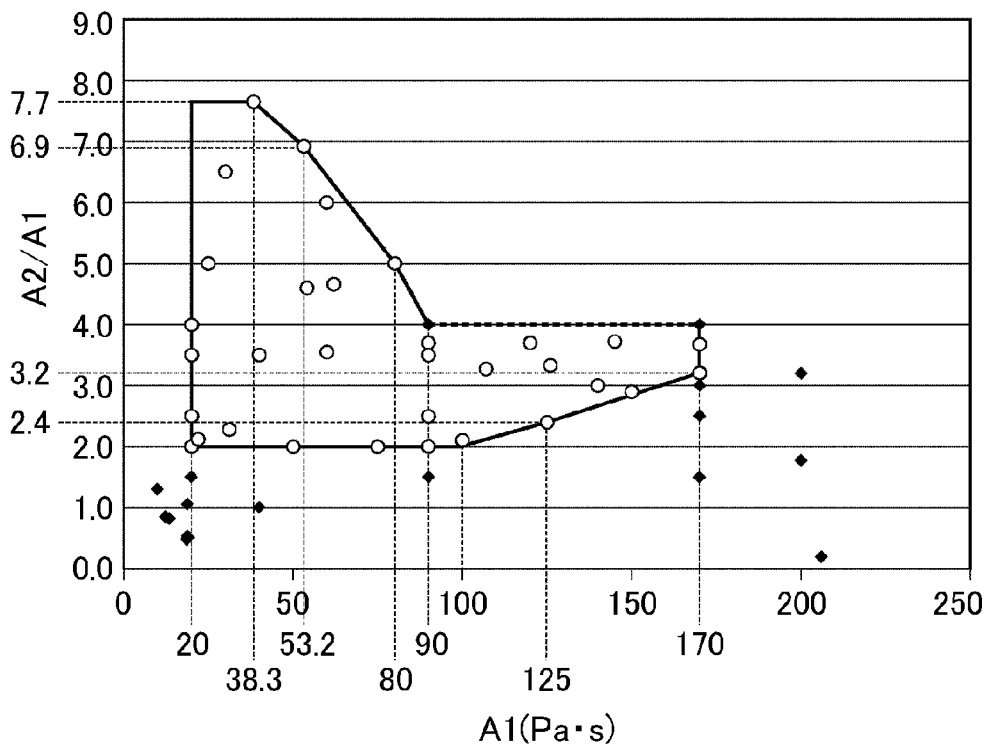
FIG. 3 is a graph showing a preferable range of A1 and A2/A1 wherein the viscosity at 5 rpm of the adhesive for electronic components measured at 25° C. using an E type viscometer is A1 (Pa·s) and the viscosity at 0.5 rpm of the adhesive for electronic components measured at 25° C. using an E type viscometer is A2 (Pa·s), and the relationships between A1 and A2/A1 obtained in the examples and comparative examples are plotted.

According to each of the compositions shown in Tables 1 to 4, materials shown below (parts by weight) were stirred and mixed using a homodisper to prepare an adhesive for electronic components. In the obtained adhesive for electronic components, using an E type viscosity measurement apparatus (VISCOMETER TV-22, made by TOKAI SANGYO CO., LTD.), a viscosity A1 at the number of rotations of 5 rpm and a viscosity A2 at the number of rotations of 0.5 rpm were measured at a setting temperature of 25° C. A1, A2, and A2/A1 are shown in Tables 1 to 4. A graph showing the relationship between A1 and A2/A1 is shown in FIG. 2, wherein the abscissa indicates A1 (Pa·s), the ordinate indicates A2/A1, and the relationships between A1 and A2/A1 obtained in Examples 1 to 33 and Comparative Examples 1 to 12 and 14 to 20 are plotted. In the plotting, the examples were expressed by a circular symbol (white blank symbol), and the comparative examples were expressed by a rhombus symbol (solid symbol).

In the obtained adhesives for electronic components, each of the adhesives was cured on the condition of 170° C. and for 30 minutes. Then, using a TMA/SS6000 (made by Seiko Instruments Inc.), two cycles of expansion and contraction at 30 to 300° C. (the temperature was raised by 10° C.) were performed in a tensile mode. From the curve of the second cycle, the coefficient of linear expansion was determined.

1. Epoxy Compound

Aniline epoxy compound (EP-3900S, made by Adeka Corporation)

Naphthalene epoxy compound (EXA-4710, made by Adeka Corporation)

Glycidylamine epoxy compound (YH-434L, made by Shinnittetsu Kagaku K.K.)

Bisphenol F epoxy compound (EXA-830CRP, made by DIC Corporation)

2. Episulfide Compound

Naphthalene episulfide compound (100 g of naphthalene epoxy (HP-4032D, made by DIC Corporation, epoxy equivalent=140 g/eq.) and 200 g of tetrahydrofuran were put into a flask, and stirred at room temperature to dissolve the epoxy compound. After the epoxy compound was dissolved, 100 g of thiourea and 200 g of methanol were added. The reaction was allowed to proceed for 5 hours with stirring at a temperature of 30 to 35° C. After the reaction was completed, 300 g of methyl isobutyl ketone was added, and washing with 250 g of pure water was performed 5 times. After washing with water, using a rotary evaporator, methyl isobutyl ketone was distilled under reduced pressure at a temperature of 90° C. to obtain 101.2 g of a naphthalene episulfide compound as a colorless transparent liquid.)

3. Bismaleimide Compound

Bismaleimide compound (BMI-1000, made by Daia Kasei Kogyo Co., Ltd.)

4. Curing Agent

Acid anhydride curing agent (YH-307, made by JER Co. Ltd.)

Acid anhydride curing agent (YH-306, made by JER Co. Ltd.)

Phenol curing agent (MEH-8000H, made by Meiwa Plastic Industries, Ltd.)

5. Curing Accelerator

Imidazole compound (2MA-OK, made by SHIKOKU CHEMICALS CORPORATION)

6. Inorganic Filler 6-1. Inorganic Filler Having an M Value of 20 or Less (Inorganic Filler (1))

SE-2050 (silica filler, made by Admatechs Company Limited, average particle size of 0.5 μm, the largest particle size of 3 μm, no surface treatment, M value of 0)

SE-1050 (silica filler, made by Admatechs Company Limited, average particle size of 0.3 μm, the largest particle size of 1 μm, no surface treatment, M value of 0)

SE-4050 (silica filler, made by Admatechs Company Limited, average particle size of 1 μm, the largest particle size of 5 μm, no surface treatment, M value of 0)

SE-1050-SET (silica filler, made by Admatechs Company Limited, average particle size of 0.3 μm, the largest particle size of 1 μm, inorganic filler having a group derived from a expoxysilane compound, M value of 20)

6-2. Inorganic Filler Having an M Value of 45 or More (Inorganic Filler (2))

MT-10 (fumed silica, made by Tokuyama Corporation, M value of 47)

SE-2050-STJ (silica filler, made by Admatechs Company Limited, average particle size of 0.5 μm, the largest particle size of 3 μm, inorganic filler having a group derived from a methylsilane compound, M value of 64)

SE-1050-STT (silica filler, made by Admatechs Company Limited, average particle size of 0.3 μm, the largest particle size of 1 μm, inorganic filler having a group derived from a methylsilane compound, M value of 64)

PM-20 L (fumed silica, made by Tokuyama Corporation, M value of 65)

6-3. Other Inorganic Fillers

SE-2050-SPJ (silica filler, made by Admatechs Company Limited, average particle size of 0.5 μm, the largest particle size of 3 μm, inorganic filler having a group derived from a phenylsilane compound, M value of 30)

SE-1050-SPT (silica filler, made by Admatechs Company Limited, average particle size of 0.3 μm, the largest particle size of 1 μm, inorganic filler having a group derived from a phenylsilane compound, M value of 30)

SE-1050-SMT (silica filler, made by Admatechs Company Limited, average particle size of 0.3 μm, the largest particle size of 1 μm, inorganic filler having a group derived from a methacrylic silane compound, M value of 40)

SE-2050-SMJ (silica filler, made by Admatechs Company Limited, average particle size of 0.5 μm, the largest particle size of 3 μm, inorganic filler having a group derived from a methacrylic silane compound, M value of 40)

7. Surfactant 7-1. Surfactant Having Functional Group Whose SP Value is 13 or More and Functional Group Whose SP Value is not Less than 9 and Less than 13 (Surfactant (1))

BYK-W9010 (silicone compound, made by BYK Japan K.K., having a phosphate group whose SP value is 13.36 and a polyether group whose SP value is 9.71)

X-22-3939A (amino•polyether-modified silicone oil, made by Shin-Etsu Chemical Co., Ltd., having a primary amine group whose SP value is 16.5 and a polyether group whose SP value is 9.71)

7-2. Surfactant Having Functional Group Whose SP Value is Less than 9 and Functional Group Whose SP Value is not Less than 9 and Less than 13 (Surfactant (2))

KF-101 (epoxy-modified silicone oil, made by Shin-Etsu Chemical Co., Ltd., having an epoxy group whose SP value is 12.04 and a dimethylsiloxane group whose SP value is 7.40)

X-22-4741 (epoxy•polyether-modified silicone oil, made by Shin-Etsu Chemical Co., Ltd., having an epoxy group whose SP value is 12.04 and a dimethylsiloxane group whose SP value is 7.55)

(2) Production of Semiconductor Chip Mount

The obtained adhesive for electronic components was put into a 10 mL syringe (made by Iwashita Engineering, Inc.). A precision nozzle (made by Iwashita Engineering, Inc., the diameter of the leading end of the nozzle of 0.3 mm) was attached to the leading end of the syringe. Using a dispenser (SHOT MASTER 300, made by Musashi Engineering, Inc.), the adhesive was applied onto a substrate (WALTS-KIT MB50-0101JY, made by WALTS CO., LTD.) at an ejection pressure of 0.4 MPa, a gap between the substrate and the needle of 200 μm, and an application amount of the adhesive of 3.3 μL.

Using a flip chip bonder (FC3000S, made by Toray Engineering Co., Ltd.), a semiconductor chip having a projected electrode made of solder (WALTS-TEG MB50-0101JY, melting temperature of solder of 235° C., made by WALTS CO., LTD.) was pressed at 140° C. and 20 N for 1 second. Thereby, the projected electrode of the semiconductor chip was contacted with the electrode portion on the substrate with the applied adhesive for electronic components being interposed therebetween, and the adhesive for electronic components was injected into the sealed region. Next, heating was performed at 260° C. and 1 N for 3 seconds to cure the adhesive for electronic components in the bonding portion. Then, the obtained workpiece was aged in an oven at 170° C. for 30 minutes to completely cure the adhesive for electronic components. Thus, a semiconductor chip mount was obtained.

<Evaluation>

The semiconductor chip mounts obtained in the examples and comparative examples were evaluated as follows. The results are shown in Tables 1 to 4.

(1) Evaluation of Wicking (Adhesion to Attachment)

A flow of the adhesive for electronic components was observed during and after mounting of the semiconductor chip to the substrate. Based on this observation, adhesion of the adhesive for electronic components to the attachment of the flip chip bonder (FC-3000S, made by Toray Engineering Co., Ltd.) was evaluated according to the following criterion.

O: The adhesive for electronic components did not wick up beyond the thickness of the semiconductor chip, and did not adhere to the attachment.

X: The adhesive for electronic components wicked up beyond the thickness of the semiconductor chip, and adhered to the attachment.

(2) Occurrence of Voids

Using an ultrasonic imaging system (mi-scope hyper II, made by Hitachi Construction Machinery Fine Tech Co., Ltd.), voids in the obtained semiconductor chip mount were observed, and evaluated according to the following criterion.

O: Voids were hardly found.

Δ: Voids were slightly found.

X: Remarkable peeling caused by voids was found.

(3) Application Properties

The adhesive for electronic components was applied onto a substrate on the same condition as that in production of the semiconductor chip mount. At this time, drawing lines were observed when the adhesive was continuously applied to sixteen substrates.

O: Ten drawing lines having a length of 10 cm could be drawn without a break in a substrate and between the substrates.

Δ: Ten drawing lines having a length of 10 cm could be drawn without a break in a substrate and between the substrates, but there were portions in which the line width was 50% or less reduced or 100% or more increased.

X: The drawing line was broken in a substrate or between the substrates (including the case where there were portions in which the line width was 50% or less reduced or 100% or more increased).

(4) Shape Keeping Properties of Applied Adhesive for Electronic Components

The applied adhesive for electronic components produced above was placed on a hot plate at 80° C., and deformation of the shape of the adhesive was observed.

O: The shape retention time was 1 hour or more.

Δ: The shape retention time was not less than 30 minutes and less than 1 hour.

X: The shape retention time was less than 30 minutes.

TABLE 1

|  |  |  | Examples | | | | | | | | | | |
|---|---|---|---|---|---|---|---|---|---|---|---|---|---|
|  |  |  | 1 | 2 | 3 | 4 | 5 | 6 | 7 | 8 | 9 | 10 | 11 |
| Composition (parts by weight) | Epoxy compound | EP-3900S | 90 | 50 | 90 | 100 | 90 | 100 | 90 | 90 | 90 | 90 | — |
|  |  | EXA-4710 | 10 | — | 10 | — | 10 | — | 10 | 10 | — | 10 | — |
|  |  | YH-434L | — | — | — | — | — | — | — | — | 10 | — | — |
|  |  | EXA-830CRP | — | 50 | — | — | — | — | — | — | — | — | 90 |

TABLE 1-continued

|  |  | Examples | | | | | | | | | | |
|---|---|---|---|---|---|---|---|---|---|---|---|---|
|  |  | 1 | 2 | 3 | 4 | 5 | 6 | 7 | 8 | 9 | 10 | 11 |
| Episulfide compound | Naphthalene episulfide | — | — | — | — | — | — | — | — | — | — | 10 |
| Bismaleimide compound | BMI-1000 | — | — | — | — | — | — | — | — | — | — | — |
| Curing agent | YH-307 | 89.7 | — | 89.7 | 93.6 | 89.7 | 93.6 | 89.7 | 89.7 | — | 89.7 | 55 |
|  | YH-306 | — | — | — | — | — | — | — | — | 92.1 | — | — |
|  | MEH-8000H | — | 30 | — | — | — | — | — | — | — | — | — |
| Curing accelerator | 2MA-OK | 8 | 8 | 8 | 8 | 8 | 8 | 8 | 8 | 8 | 8 | 8 |
| Inorganic filler (1) | SE-2050(M value: 0) | — | — | — | — | — | — | — | — | — | — | — |
|  | SE-1050(M value: 0) | — | — | — | — | — | — | — | — | — | — | — |
|  | SE-4050(M value: 0) | — | — | — | — | — | — | — | — | — | — | — |
|  | SE-1050-SET(M value: 20) | — | — | — | 201.3 | — | 96 | — | — | 200.9 | — | — |
| Other inorganic fillers | SE-2050-SPJ(M value: 30) | 74 | — | 36 | — | 96 | 224 | 48 | 74 | — | 260 | — |
|  | SE-1050-SPT(M value: 30) | — | 89.8 | — | — | — | — | — | — | 139.8 | — | 121 |
|  | SE-1050-SMT(M value: 40) | — | — | — | — | — | — | — | — | — | — | — |
|  | SE-2050-SMJ(M value: 40) | — | — | — | — | — | — | — | — | — | — | — |
| Inorganic filler (2) | MT-10(M value: 47) | — | — | — | — | — | — | — | — | — | — | — |
|  | SE-2050-STJ(M value: 64) | — | — | — | — | — | — | — | — | — | — | — |
|  | SE-1050-STT(M value: 64) | — | — | — | — | — | — | — | — | — | — | — |
|  | PM-20L(M value: 65) | 4 | — | 5 | — | 4.5 | — | 5.5 | 6 | — | 10.8 | — |
| Surfactant (1) | BYK-W9010 (SP value: 13.36 and 9.71) | — | — | — | — | — | — | — | — | — | — | — |
|  | X-22-3939A (SP value: 16.5 and 9.71) | — | — | — | — | — | — | — | — | — | — | — |
| Surfactant (2) | KF-101 (SP value: 12.04 and 7.40) | — | — | — | — | — | — | — | — | — | — | — |
|  | X-22-4741 (SP value: 12.04 and 7.55) | — | — | — | — | — | — | — | — | — | — | — |
| Viscosity A1 at 25° C., 5 rpm (Pa·s) |  | 20 | 20 | 20 | 20 | 90 | 90 | 90 | 145 | 170 | 126 | 100 |
| Viscosity A2 at 25° C., 0.5 rpm (Pa·s) |  | 40 | 50 | 70 | 80 | 180 | 225 | 315 | 540 | 626 | 420 | 210 |
| A2/A1 |  | 2 | 2.5 | 3.5 | 4 | 2 | 2.5 | 3.5 | 3.7 | 3.7 | 3.3 | 2.1 |
| Coefficient of linear expansion (ppm/° C.) |  | 61 | 49 | 75 | 43 | 56 | 32 | 70 | 61 | 29 | 40 | 48 |
| Evaluation | Adhesion to attachment | ○ | ○ | ○ | ○ | ○ | ○ | ○ | ○ | ○ | ○ | ○ |
|  | Occurrence of voids | ○ | ○ | ○ | ○ | ○ | ○ | ○ | ○ | ○ | ○ | ○ |
|  | Application properties | ○ | ○ | ○ | ○ | ○ | ○ | ○ | Δ | Δ | Δ | ○ |
|  | Shape keeling properties | ○ | ○ | ○ | ○ | ○ | ○ | ○ | ○ | ○ | ○ | ○ |

TABLE 2

|  |  |  | Examples | | | | | | | | | | |
|---|---|---|---|---|---|---|---|---|---|---|---|---|---|
|  |  |  | 12 | 13 | 14 | 15 | 16 | 17 | 18 | 19 | 20 | 21 | 22 |
| Composition (parts by weight) | Epoxy compound | EP-3900S | — | 100 | 100 | 100 | 100 | 100 | 100 | 100 | 90 | — | 100 |
|  |  | EXA-4710 | — | — | — | — | — | — | — | — | 10 | — | — |
|  |  | YH-434L | — | — | — | — | — | — | — | — | — | — | — |
|  |  | EXA-830CRP | 28 | — | — | — | — | — | — | — | — | 90 | — |
|  | Episulfide compound | Naphthalene episulfide | 72 | — | — | — | — | — | — | — | — | 10 | — |
|  | Bismaleimide compound | BMI-1000 | — | — | — | — | — | — | — | — | — | — | — |
|  | Curing agent | YH-307 | 19.2 | 100 | 100 | 100 | 100 | 100 | 100 | 100 | 89.7 | 55 | 100 |
|  |  | YH-306 | — | — | — | — | — | — | — | — | — | — | — |
|  |  | MEH-8000H | — | — | — | — | — | — | — | — | — | — | — |
|  | Curing accelerator | 2MA-OK | 4.8 | 16 | 16 | 16 | 16 | 16 | 16 | 16 | 16 | 8 | 16 |
|  | Inorganic filler (1) | SE-2050(M value: 0) | — | — | — | — | — | — | — | — | — | — | — |
|  |  | SE-1050(M value: 0) | — | — | — | — | — | — | — | — | — | — | — |
|  |  | SE-4050(M value: 0) | 120 | — | — | — | — | — | — | — | — | — | — |
|  |  | SE-1050-SET(M value: 20) | — | — | — | — | — | — | — | — | — | — | — |
|  | Other inorganic fillers | SE-2050-SPJ(M value: 30) | — | — | — | — | — | — | — | — | — | — | — |
|  |  | SE-1050-SPT(M value: 30) | — | — | — | — | — | — | — | — | — | 121 | — |
|  |  | SE-1050-SMT(M value: 40) | — | — | — | — | — | — | — | — | — | — | — |
|  |  | SE-2050-SMJ(M value: 40) | — | — | — | — | — | 64 | 32 | 160 | 160 | — | — |
|  | Inorganic filler (2) | MT-10(M value: 47) | — | — | — | — | — | — | — | — | — | — | — |
|  |  | SE-2050-STJ(M value: 64) | — | 320 | 320 | — | 320 | 256 | 288 | 160 | 160 | 30 | 320 |
|  |  | SE-1050-STT(M value: 64) | — | — | — | 320 | — | — | — | — | — | — | — |
|  |  | PM-20L(M value: 65) | — | — | — | — | — | — | — | — | — | — | 5 |
|  | Surfactant (1) | BYK-W9010 (SP value: 13.36 and 9.71) | 0.67 | — | — | — | — | — | — | — | — | — | — |
|  |  | X-22-3939A (SP value: 16.5 and 9.71) | — | — | — | — | 2 | — | — | — | — | — | — |
|  | Surfactant (2) | KF-101 (SP value: 12.04 and 7.40) | — | 2 | — | 2 | — | 2 | 2 | 2 | 2 | 2 | — |
|  |  | X-22-4741 (SP value: 12.04 and 7.55) | — | — | 2 | — | — | — | — | — | — | — | — |

TABLE 2-continued

| | | | | | | | | | | | | |
|---|---|---|---|---|---|---|---|---|---|---|---|---|
| | Viscosity A1 at 25° C., 5 rpm (Pa · s) | | 60 | 38.3 | 54.1 | 53.2 | 62 | 25 | 30 | 50 | 75 | 125 | 150 |
| | Viscosity A2 at 25° C., 0.5 rpm (Pa · s) | | 213 | 293 | 249 | 368 | 289 | 125 | 195 | 100 | 150 | 300 | 435 |
| | A2/A1 | | 3.6 | 7.7 | 4.6 | 6.9 | 4.7 | 5 | 6.5 | 2 | 2 | 2.4 | 2.9 |
| | Coefficient of linear expansion (ppm/° C.) | | 38 | 30 | 30 | 30 | 30 | 30 | 30 | 30 | 30 | 42 | 30 |
| Evaluation | Adhesion to attachment | | ◯ | ◯ | ◯ | ◯ | ◯ | ◯ | ◯ | ◯ | ◯ | ◯ | ◯ |
| | Occurrence of voids | | ◯ | ◯ | ◯ | ◯ | ◯ | ◯ | ◯ | ◯ | ◯ | ◯ | ◯ |
| | Application properties | | ◯ | ◯ | ◯ | ◯ | ◯ | ◯ | ◯ | ◯ | ◯ | Δ | Δ |
| | Shape keeling properties | | ◯ | ◯ | ◯ | ◯ | ◯ | ◯ | ◯ | ◯ | ◯ | ◯ | ◯ |

| | | | Examples | | | | | | | | | | |
|---|---|---|---|---|---|---|---|---|---|---|---|---|---|
| | | | 23 | 24 | 25 | 26 | 27 | 28 | 29 | 30 | 31 | 32 | 33 |
| Composition (parts by weight) | Epoxy compound | EP-3900S | 100 | — | 80 | 100 | 90 | 100 | 100 | 90 | 100 | 100 | 100 |
| | | EXA-4710 | — | — | 20 | — | — | — | — | — | — | — | — |
| | | YH-434L | — | — | — | — | 10 | — | — | — | — | — | — |
| | | EXA-830CRP | — | — | — | — | — | — | — | — | — | — | — |
| | Episulfide compound | Naphthalene episulfide | — | 72 | — | — | — | — | — | — | — | — | — |
| | Bismaleimide compound | BMI-1000 | — | — | — | — | — | — | — | — | 10 | — | — |
| | Curing agent | YH-307 | 100 | 19.2 | 100 | 100 | — | 100 | 100 | 100 | 100 | 100 | 100 |
| | | YH-306 | — | — | — | — | 92.1 | — | — | — | — | — | — |
| | | MEH-8000H | — | — | — | — | — | — | — | — | — | — | — |
| | Curing accelerator | 2MA-OK | 16 | 4.8 | 16 | 16 | 8 | 16 | 16 | — | — | 16 | 16 |
| | Inorganic filler (1) | SE-2050(M value: 0) | — | — | — | — | — | 320 | — | — | — | — | — |
| | | SE-1050(M value: 0) | — | — | — | — | — | — | — | — | — | 40 | 30 |
| | | SE-4050(M value: 0) | — | 120 | — | — | — | — | — | — | — | — | — |
| | Other inorganic fillers | SE-1050-SET(M value: 20) | — | — | — | — | 190 | — | — | — | — | — | — |
| | | SE-2050-SPJ(M value: 30) | — | — | — | — | — | — | — | — | — | 280 | 280 |
| | | SE-1050-SPT(M value: 30) | — | 30 | — | — | 150 | — | — | — | — | — | — |
| | | SE-1050-SMT(M value: 40) | — | — | — | — | — | — | — | — | — | — | — |
| | | SE-2050-SMJ(M value: 40) | 20 | — | 150 | — | — | — | — | — | 320 | — | — |
| | Inorganic filler (2) | MT-10(M value: 47) | — | — | — | — | — | — | — | — | 5 | — | — |
| | | SE-2050-STJ(M value: 64) | — | — | 170 | 320 | — | — | 320 | 320 | — | — | — |
| | | SE-1050-STT(M value: 64) | 300 | — | — | — | — | — | — | — | — | — | — |
| | | PM-20L(M value: 65) | — | — | — | 8 | — | 10.8 | 10.8 | — | — | — | — |
| | Surfactant (1) | BYK-W9010 (SP value: 13.36 and 9.71) | — | — | — | — | — | — | — | — | — | 0.67 | 0.67 |
| | | X-22-3939A (SP value: 16.5 and 9.71) | — | — | — | — | — | — | — | — | — | — | — |
| | Surfactant (2) | KF-101 (SP value: 12.04 and 7.40) | 2 | — | — | 2 | — | — | — | 2 | 2 | — | — |
| | | X-22-4741 (SP value: 12.04 and 7.55) | — | — | — | — | — | — | — | — | — | — | — |
| | Viscosity A1 at 25° C., 5 rpm (Pa · s) | | 60 | 80 | 90 | 120 | 170 | 126 | 107 | 140 | 40 | 22 | 31.2 |
| | Viscosity A2 at 25° C., 0.5 rpm (Pa · s) | | 360 | 400 | 333 | 444 | 544 | 420 | 350 | 420 | 140 | 46.7 | 71.2 |
| | A2/A1 | | 6 | 5 | 3.7 | 3.7 | 3.2 | 3.3 | 3.3 | 3 | 3.5 | 2.1 | 2.3 |
| | Coefficient of linear expansion (ppm/° C.) | | 30 | 36 | 30 | 30 | 30 | 30 | 30 | 30 | 30 | 30 | 30 |
| Evaluation | Adhesion to attachment | | ◯ | ◯ | ◯ | ◯ | ◯ | ◯ | ◯ | ◯ | ◯ | ◯ | ◯ |
| | Occurrence of voids | | ◯ | ◯ | ◯ | ◯ | ◯ | ◯ | ◯ | ◯ | ◯ | ◯ | ◯ |
| | Application properties | | ◯ | ◯ | ◯ | Δ | Δ | Δ | Δ | ◯ | ◯ | ◯ | ◯ |
| | Shape keeling properties | | ◯ | ◯ | ◯ | ◯ | ◯ | ◯ | ◯ | ◯ | ◯ | ◯ | ◯ |

TABLE 3

| | | | Comparative Examples | | | | | | | | | | | | |
|---|---|---|---|---|---|---|---|---|---|---|---|---|---|---|---|
| | | | 1 | 2 | 3 | 4 | 5 | 6 | 7 | 8 | 9 | 10 | 11 | 12 | 13 |
| Composition (parts by weight) | Epoxy compound | EP-3900S | 90 | 90 | 90 | 90 | 90 | 90 | 90 | 90 | 90 | 90 | 90 | 90 | 90 |
| | | EXA-4710 | 10 | 10 | 10 | 10 | 10 | 10 | — | 10 | 10 | 10 | 10 | 10 | 10 |
| | | YH-434L | — | — | — | — | — | — | 10 | — | — | — | — | — | — |
| | | EXA-830CRP | — | — | — | — | — | — | — | — | — | — | — | — | — |
| | Episulfide compound | Naphthalene episulfide | — | — | — | — | — | — | — | — | — | — | — | — | — |
| | Bismaleimide compound | BMI-1000 | — | — | — | — | — | — | — | — | — | — | — | — | — |
| | Curing agent | YH-307 | 89.7 | 89.7 | 89.7 | 89.7 | 89.7 | 89.7 | — | 89.7 | 89.7 | 89.7 | 89.7 | 89.7 | 89.7 |
| | | YH-306 | — | — | — | — | — | — | 92.1 | — | — | — | — | — | — |
| | | MEH-8000H | — | — | — | — | — | — | — | — | — | — | — | — | — |
| | Curing accelerator | 2MA-OK | 8 | 8 | 8 | 8 | 8 | 8 | 8 | 8 | 8 | 8 | 8 | 8 | 8 |
| | Inorganic filler (1) | SE-2050 (M value: 0) | — | — | — | — | — | — | — | — | — | — | — | — | — |
| | | SE-1050 (M value: 0) | — | — | — | — | — | — | — | — | — | — | — | — | — |
| | | SE-4050 (M value: 0) | — | — | — | — | — | — | — | — | — | — | — | — | — |

TABLE 3-continued

| | | Comparative Examples | | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 | 13 |
| Other inorganic fillers | SE-1050-SET (M value: 20) | — | 32.76 | 218 | 183.2 | 98.3 | 163.8 | 210 | 297 | 131 | — | — | — | — |
| | SE-2050-SPJ (M value: 30) | 80 | — | — | — | — | — | — | — | — | — | — | — | — |
| | SE-1050-SPT (M value: 30) | — | — | — | 183.2 | — | — | 139.8 | — | — | 242 | 366 | — | — |
| | SE-1050-SMT (M value: 40) | — | 294.9 | — | — | 229.3 | 163.8 | — | — | 197 | — | — | 327 | — |
| | SE-2050-SMJ (M value: 40) | — | — | — | — | — | — | — | — | — | — | — | — | — |
| Inorganic filler (2) | MT-10 (M value: 47) | — | — | — | — | — | — | — | — | — | — | — | — | — |
| | SE-2050-STJ (M value: 64) | — | — | — | — | — | — | — | — | — | — | — | — | — |
| | SE-1050-STT (M value: 64) | — | — | — | — | — | — | — | — | — | — | — | — | 327 |
| | PM-20L (M value: 65) | 2.5 | — | — | — | — | — | — | — | — | — | — | — | — |
| Surfactant (1) | BYK-W9010 (SP value: 13.36 and 9.71) | — | — | — | — | — | — | — | — | — | — | — | — | — |
| | X-22-3939A (SP value: 16.5 and 9.71) | — | — | — | — | — | — | — | — | — | — | — | — | — |
| Surfactant (2) | KF-101 (SP value: 12.04 and 7.40) | — | — | — | — | — | — | — | — | — | — | — | — | — |
| | X-22-4741 (SP value: 12.04 and 7.55) | — | — | — | — | — | — | — | — | — | — | — | — | — |
| Viscosity A1 at 25° C., 5 rpm (Pa · s) | | 20 | 90 | 90 | 170 | 170 | 170 | 170 | 200 | 200 | 10 | 206 | 40 | 367 |
| Viscosity A2 at 25° C., 0.5 rpm (Pa · s) | | 30 | 135 | 360 | 255 | 425 | 510 | 680 | 354 | 640 | 13 | 40 | 40 | 35 |
| A2/A1 | | 1.5 | 1.5 | 4 | 1.5 | 2.5 | 3 | 4 | 1.8 | 3.2 | 1.3 | 0.2 | 1 | 0.1 |
| Coefficient of linear expansion (ppm/° C.) | | 59 | 30 | 41 | 29 | 29 | 29 | 29 | 31 | 30 | 40 | 28 | 30 | 30 |
| Evaluation | Adhesion to attachment | ○ | ○ | X | ○ | ○ | ○ | ○ | X | ○ | ○ | ○ | ○ | ○ |
| | Occurrence of voids | X | X | ○ | X | Δ | X | ○ | X | X | X | X | X | X |
| | Application properties | ○ | ○ | ○ | X | X | X | X | X | X | ○ | X | X | X |
| | Shape keeling properties | X | Δ | ○ | Δ | ○ | ○ | ○ | ○ | ○ | X | X | X | X |

TABLE 4

| | | Comparative Examples | | | | | | |
|---|---|---|---|---|---|---|---|---|
| | | 14 | 15 | 16 | 17 | 18 | 19 | 20 |
| Composition (parts by weight) | Epoxy compound | | | | | | | |
| | EP-3900S | 100 | 100 | 100 | 100 | 100 | 100 | 100 |
| | EXA-4710 | — | — | — | — | — | — | — |
| | YH-434L | — | — | — | — | — | — | — |
| | EXA-830CRP | — | — | — | — | — | — | — |
| | Episulfide compound Naphthalene episulfide | — | — | — | — | — | — | — |
| | Bismaleimide compound BMI-1000 | — | — | — | — | — | — | — |
| | Curing agent YH-307 | 100 | 100 | 100 | 100 | 100 | 100 | 100 |
| | YH-306 | — | — | — | — | — | — | — |
| | MEH-8000H | — | — | — | — | — | — | — |
| | Curing accelerator 2MA-OK | 16 | 16 | 16 | 16 | 16 | 16 | 16 |
| | Inorganic filler (1) SE-2050(M value: 0) | 320 | 320 | — | — | — | — | — |
| | SE-1050(M value: 0) | — | — | — | — | — | — | — |
| | SE-4050(M value: 0) | — | — | — | — | — | — | — |
| | SE-1050-SET(M value: 20) | — | — | — | — | — | — | — |
| | Other inorganic fillers SE-2050-SPJ(M value: 30) | — | — | — | — | — | — | — |
| | SE-1050-SPT(M value: 30) | — | — | — | — | — | — | — |
| | SE-1050-SMT(M value: 40) | — | — | — | — | — | — | — |
| | SE-2050-SMJ(M value: 40) | — | — | — | — | 320 | 320 | 320 |
| | Inorganic filler (2) MT-10(M value: 47) | — | — | — | — | — | — | — |
| | SE-2050-STJ(M value: 64) | — | — | 320 | 320 | — | — | — |
| | SE-1050-STT(M value: 64) | — | — | — | — | — | — | — |
| | PM-20L(M value: 65) | — | — | — | — | — | — | — |
| | Surfactant (1) BYK-W9010 (SP value: 13.36 and 9.71) | — | — | — | 0.67 | — | — | 0.67 |
| | X-22-3939A (SP value: 16.5 and 9.71) | — | — | — | — | — | — | — |

TABLE 4-continued

| | | Comparative Examples | | | | | | |
|---|---|---|---|---|---|---|---|---|
| | | 14 | 15 | 16 | 17 | 18 | 19 | 20 |
| Surfactant (2) | KF-101 (SP value: 12.04 and 7.40) | — | 2 | — | — | — | 2 | — |
| | X-22-4741 (SP value: 12.04 and 7.55) | — | — | — | — | — | — | — |
| Viscosity A1 at 25° C., 5 rpm (Pa·s) | | 18.8 | 12.3 | 18.8 | 13.4 | 19.2 | 18.6 | 18.9 |
| Viscosity A2 at 25° C., 0.5 rpm (Pa·s) | | 20 | 10.5 | 10 | 11 | 9.8 | 8.9 | 9.4 |
| A2/A1 | | 1.1 | 0.9 | 0.5 | 0.8 | 0.5 | 0.5 | 0.5 |
| Coefficient of linear expansion (ppm/° C.) | | 30 | 30 | 30 | 30 | 30 | 30 | 30 |
| Evaluation | Adhesion to attachment | ○ | ○ | ○ | ○ | ○ | ○ | ○ |
| | Occurrence of voids | X | X | X | X | X | X | X |
| | Application properties | ○ | ○ | ○ | ○ | ○ | ○ | ○ |
| | Shape keeling properties | X | X | X | X | X | X | X |

INDUSTRIAL APPLICABILITY

The present invention can provide an adhesive for electronic components that allows suppression of occurrence of voids and is prevented from wicking up to an upper surface of a semiconductor chip. The present invention also can provide a production method for a semiconductor chip mount using the adhesive for electronic components.

Figure 1A:
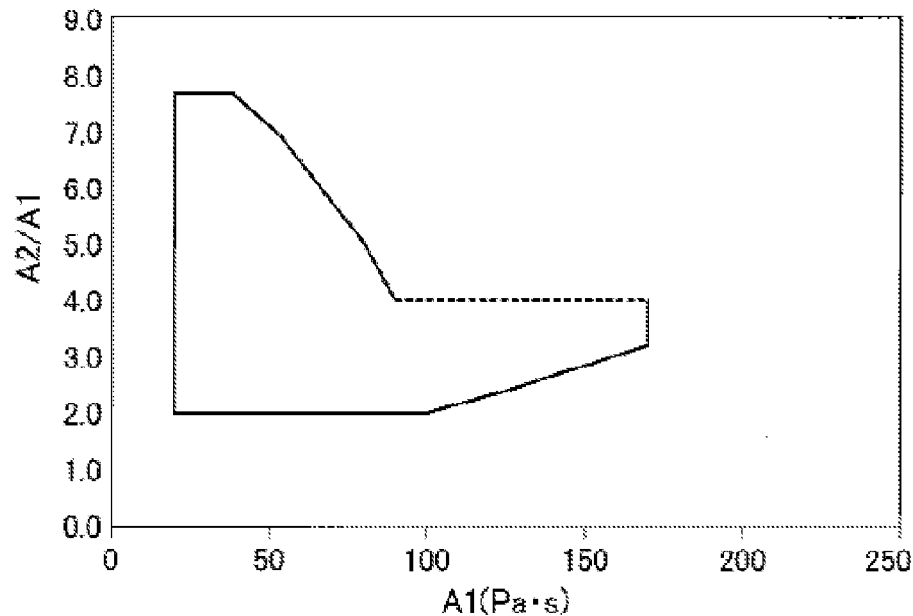
FIG. 1A is a graph showing a range of A1 and A2/A1 specified in the present invention (values on the solid lines are included but values on the dashed line are not included) wherein a viscosity at 5 rpm of the adhesive for electronic components measured at 25° C. using an E type viscometer is A1 (Pa·s) and a viscosity at 0.5 rpm of the adhesive for electronic components measured at 25° C. using an E type viscometer is A2 (Pa·s).
Figure 1B:
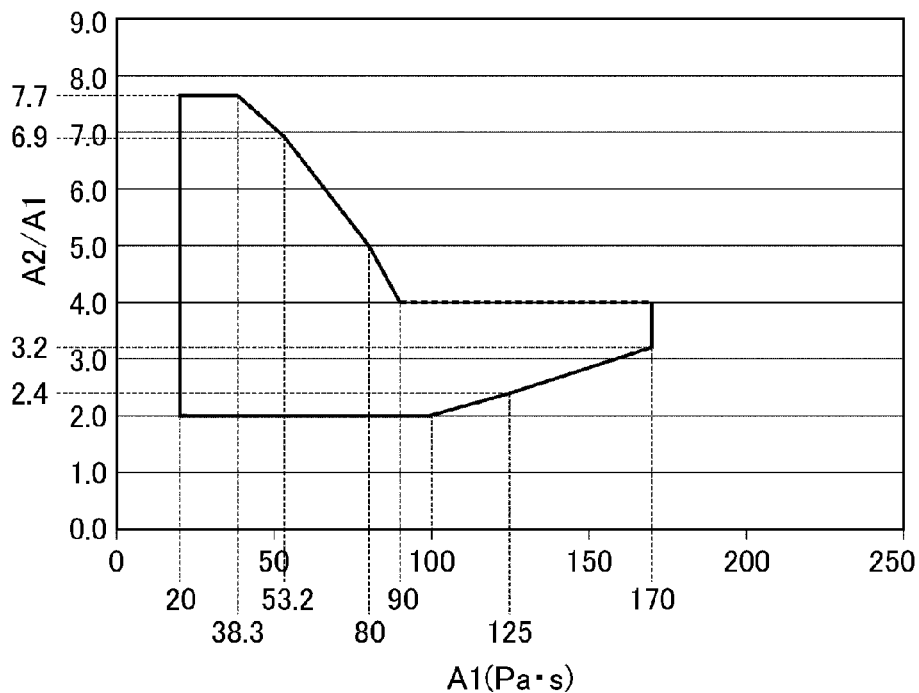
FIG. 1B is a replica of FIG. 1A, but further identifies specific values in the graph.

The invention claimed is:

1. An adhesive for electronic components, comprising a curable compound, a curing agent, an inorganic filler, and a surfactant,
   wherein the surfactant has a functional group whose solubility parameter (SP value) is 13 or more and a functional group whose solubility parameter (SP value) is not less than 9 and less than 13,
   wherein the inorganic filler has a degree of hydrophobicity (M value) of 20 or less,
   wherein A1 and A2/A1 fall within a range surrounded by solid lines and a dashed line in FIG. 1A wherein a viscosity at 5 rpm measured at 25° C. using an E type viscometer is A1 (Pa·s) and a viscosity at 0.5 rpm measured at 25° C. using an E type viscometer is A2 (Pa·s), the range including values on the solid lines but not including values on the dashed line, and
   wherein a blending amount of the curing agent is 5 to 150 parts by weight and a blending amount of the inorganic filler is 60 to 400 parts by weight based on 100 parts by weight of the curable compound.

2. The adhesive for electronic components according to claim 1, wherein the inorganic filler has an average particle size of 0.1 to 3 μm.

3. The adhesive for electronic components according to claim 1, wherein a coefficient of linear expansion at 40 to 80° C. of the adhesive after curing is 20 to 50 ppm/° C.

4. The adhesive for electronic components according to claim 1, wherein the curable compound contains at least one compound selected from the group consisting of epoxy compounds, bismaleimide compounds, and episulfide compounds.

5. The adhesive for electronic components according to claim 1, wherein the inorganic filler includes an inorganic filler having on its surface a group derived from a phenylsilane compound or a (meth)acrylic silane compound.

6. The adhesive for electronic components according to claim 5, wherein the inorganic filler further includes an inorganic filler having on its surface a group derived from an expoxysilane compound.

7. A production method for a semiconductor chip mount in which a semiconductor chip having a projected electrode is bonded to a substrate by flip chip mounting and sealing is performed, the method comprising the steps of:
   applying the adhesive for electronic components according to claim 1 onto a substrate;
   contacting the projected electrode of the semiconductor chip with an electrode portion on the substrate with the adhesive being interposed therebetween, and injecting the adhesive into a sealed region;
   bonding the projected electrode of the semiconductor chip to the electrode portion on the substrate, and curing the adhesive in the bonding portion; and
   completely curing the adhesive.

8. An adhesive for electronic components, comprising a curable compound, a curing agent, an inorganic filler, and a surfactant,
   wherein the surfactant has a functional group whose solubility parameter (SP value) is less than 9 and a functional group whose solubility parameter (SP value) is not less than 9 and less than 13,
   wherein the inorganic filler has a degree of hydrophobicity (M value) of 45 or more.
   wherein A1 and A2/A1 fall within a range surrounded by solid lines and a dashed line in F*ig*. 1A wherein a viscosity at 5 rpm measured at 25° C. using an E type viscometer is A1 (Pa·s) and a viscosity at 0.5 rpm measured at 25° C. using an E type viscometer is A2 (Pa·s), the range including values on the solid lines but not including values on the dashed line, and
   wherein a blending amount of the curing agent is 5 to 150 parts by weight and a blending amount of the inorganic filler is 60 to 400 parts by weight based on 100 parts by weight of the curable compound.

9. The adhesive for electronic components according to claim 8, wherein the inorganic filler has an average particle size of 0.1 to 3 μm.

10. The adhesive for electronic components according to claim 8, wherein a coefficient of linear expansion at 40 to 80° C. of the adhesive after curing is 20 to 50 ppm/° C.

11. The adhesive for electronic components according to claim 8, wherein the curable compound contains at least one compound selected from the group consisting of epoxy compounds, bismaleimide compounds, and episulfide compounds.

12. The adhesive for electronic components according to claim 8, wherein the inorganic filler includes an inorganic filler having on its surface a group derived from a phenylsilane compound or a (meth)acrylic silane compound.

13. The adhesive for electronic components according to claim 12, wherein the inorganic filler further includes an inorganic filler having on its surface a group derived from an expoxysilane compound.

14. A production method for a semiconductor chip mount in which a semiconductor chip having a projected electrode is bonded to a substrate by flip chip mounting and sealing is performed, the method comprising the steps of:
  applying the adhesive for electronic components according to claim 8 onto a substrate;
  contacting the projected electrode of the semiconductor chip with an electrode portion on the substrate with the adhesive being interposed therebetween, and injecting the adhesive into a sealed region;
  bonding the projected electrode of the semiconductor chip to the electrode portion on the substrate, and curing the adhesive in the bonding portion; and
  completely curing the adhesive.

* * * * *